(12) United States Patent
Rochas et al.

(10) Patent No.: US 11,908,832 B2
(45) Date of Patent: Feb. 20, 2024

(54) PROCESS FOR COLLECTIVELY BENDING MICROELECTRONIC COMPONENTS USING SHAPING CARRIER

(71) Applicant: COMMISSARIAT À L'ENERGIE ATOMIQUE ET AUX ENERGIES ALTERNATIVES, Paris (FR)

(72) Inventors: Alexis Rochas, Grenoble (FR); David Henry, Grenoble (FR); Stéphane Caplet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 24 days.

(21) Appl. No.: 17/645,360

(22) Filed: Dec. 21, 2021

(65) Prior Publication Data
US 2022/0199572 A1 Jun. 23, 2022

(30) Foreign Application Priority Data
Dec. 22, 2020 (FR) ...................................... 20 13960

(51) Int. Cl.
*H01L 21/52* (2006.01)
*H01L 23/00* (2006.01)
(52) U.S. Cl.
CPC .............. *H01L 24/97* (2013.01); *H01L 21/52* (2013.01); *H01L 24/08* (2013.01); *H01L 2224/08235* (2013.01)

(58) Field of Classification Search
CPC ........ H04N 25/00; H04N 23/57; H04N 23/55; H04N 23/54; H01L 27/14618;
(Continued)

(56) References Cited

U.S. PATENT DOCUMENTS

2007/0228502 A1* 10/2007 Minamio .......... H01L 27/14618
257/431
2009/0115875 A1* 5/2009 Choi ...................... H04N 25/00
257/E31.127
(Continued)

FOREIGN PATENT DOCUMENTS

JP 2020-109821 A 7/2020

OTHER PUBLICATIONS

Preliminary French Search Report dated Aug. 30, 2021 in French Application 20 13960 filed on Dec. 22, 2020, 12 pages (with English Translation of Categories of Cited Documents & Written Opinion).
(Continued)

*Primary Examiner* — Didarul A Mazumder
(74) *Attorney, Agent, or Firm* — Oblon, McClelland, Maier & Neustadt, L.L.P.

(57) ABSTRACT

The invention relates to a process for collectively bending microelectronic components comprising transferring microelectronic components (10) to and bending them on curved surfaces (21) of a shaping carrier (20), an adhesive layer (6) ensuring adhesion of the microelectronic components (10), and comprising producing conductive vias (22) that extend through the shaping carrier (20) and the adhesive lower layer (6), from the lower face (20i) of the shaping carrier (20), in order to emerge onto the lower conductive pads (12) of the microelectronic components (10).

14 Claims, 12 Drawing Sheets

(58) Field of Classification Search
CPC ......... H01L 27/14632; H01L 27/14683; H01L 24/97; H01L 27/14687; H01L 2224/16; H01L 2924/15788; H01L 2924/3511; H01L 2924/00; H01L 21/52; H01L 24/08–09; H01L 2224/08235
USPC ............... 438/113, 65; 348/294, E5.091; 257/E31.124, E31.127
See application file for complete search history.

(56) References Cited

U.S. PATENT DOCUMENTS

| | | | |
|---|---|---|---|
| 2012/0147207 A1* | 6/2012 | Itonaga | H01L 27/14618 348/222.1 |
| 2012/0217606 A1* | 8/2012 | Itonaga | H01L 31/0203 438/66 |
| 2017/0301710 A1* | 10/2017 | Shin | H01L 27/14605 |
| 2018/0145106 A1 | 5/2018 | Yang et al. | |
| 2018/0145107 A1* | 5/2018 | Yang | H01L 27/14618 |
| 2019/0140008 A1* | 5/2019 | Chambion | H01L 27/14618 |
| 2020/0185444 A1* | 6/2020 | Chiang | H01L 27/14632 |
| 2021/0151491 A1 | 5/2021 | Chiang et al. | |

OTHER PUBLICATIONS

Chambion et al., "Collective curved CMOS sensor process: application for high-resolution optical design and assembly challenges", IEEE 69th Electronic Components and Technology Conference (ECTC), 2019, 8 pages.

Wu et al., "Fabrication Techniques for Curved Electronics on Arbitrary Surfaces", Advanced Materials Technologies, vol. 5, No. 8, 2020, 29 pages.

\* cited by examiner

PROCESS FOR COLLECTIVELY BENDING MICROELECTRONIC COMPONENTS USING SHAPING CARRIER

TECHNICAL FIELD

The field of the invention is that of processes for collectively bending and packaging microelectronic components. Such a process may be a wafer-level chip-scale packaging (WLCSP) process, i.e. a wafer-scale process, and such that the assembly formed from the microelectronic component and from its electrically interconnecting carrier has lateral dimensions of the same order as those of the microelectronic component.

PRIOR ART

It may be desirable to provide microelectronic components, and in particular optoelectronic components, having a predefined curvature with respect to a reference plane. This is notably the case when it is a question of optical components for detecting or emitting light radiation, the curvature of which allows their optical performance to be improved, for example by compensating for field curvature or at least partially correcting astigmatism. In the case of emitting optical components, the curvature allows the formation of the emitted light radiation to be improved.

The realization and packaging of such microelectronic components may be carried out on the wafer level, i.e. on a given semiconductor wafer comprising a plurality of identical integrated circuits each intended to form one of the microelectronic components. Packaging consists in all of the steps of assembling the microelectronic component into a package or carrier allowing the latter to be electrically connected to an external electrical circuit, and optionally the performance thereof to be improved (thermal management, mechanical protection, reliability, etc.).

Document US2009/0115875A1 describes one example of a process for collectively bending microelectronic components 10, here optical components, on a shaping and electrically interconnecting carrier 20. The microelectronic components 10 are first produced from a given functionalized substrate. As illustrated in FIG. 1A, they are then singulated by dicing, which here is partial, then transferred to the same shaping carrier 20. The latter comprises a plurality of curved surfaces 21 (which here are concave). It also comprises electrical interconnects allowing the microelectronic components 10 and an external electrical circuit (not shown) to be electrically connected, these interconnects including conductive vias 22 that emerge onto the curved surfaces 21.

Before the transferring and joining step, the microelectronic components 10 are produced so that an adhesive lower layer 6 covers their lower face 10i. In addition, to electrically connect the microelectronic components 10, lower conductive pads 12 are produced that protrude from the free face of the adhesive lower layer 6.

Next, as illustrated in FIG. 1B, the microelectronic components 10 are transferred to the curved surfaces 21, and are deformed so that the adhesive lower layer 6 makes contact with the curved surface 21. The lower conductive pads 12 and the conductive vias 22 then make contact, thus allowing the microelectronic components 10 to be connected electrically. Now, it would appear that such a bending process may induce a curvature of the microelectronic components 10 that is not that actually desired.

Moreover, documents US2018/145107A1, US2020/185444A1, JP2020109821A, and the publication by Chambion et al. titled Collective Curved CMOS Sensor Process: Application for High-Resolution Optical Design and Assembly Challenges, IEEE 69th Electronic Components and Technology Conference, 535-542 (2019), and the publication by Wu Hao et al. titled Fabrication Techniques for Curved Electronics on Arbitrary Surfaces, Adv. Mater. Technol., 2000093 (2020), are known.

SUMMARY OF THE INVENTION

The objective of the invention is to at least partially remedy the drawbacks of the prior art, and more particularly to provide a process for collectively bending microelectronic components that allows an actual curvature of the microelectronic components that is as close as possible to the desired curvature to be obtained.

To this end, one subject of the invention is a process for collectively bending microelectronic components, comprising the following steps:
  producing a microelectronic structure, comprising a microelectronic substrate, having an upper face and an opposite lower face, comprising a plurality of microelectronic components, which each comprise lower conductive pads located on the lower face and intended to allow the microelectronic component to be connected electrically;
  providing a shaping carrier, having an upper face and an opposite lower face, the upper face comprising a plurality of curved surfaces;
  depositing an adhesive lower layer having a thickness larger than the thickness of the lower conductive pads, so as either to entirely cover the lower face of the microelectronic substrate and the lower conductive pads such that the adhesive lower layer has a free lower face that is continuous and therefore not passed right through by the lower conductive pads which would otherwise protrude from this adhesive lower layer, or to cover the curved surfaces;
  dicing the least the microelectronic substrate to singulate the microelectronic components; then
  transferring the microelectronic components to the shaping carrier; then
  bending the microelectronic components, the adhesive lower layer then making contact with the lower face of the microelectronic components and with the corresponding curved surface, thus preventing the lower conductive pads from making contact with the curved surface; then
  producing conductive vias that extend through the shaping carrier and the adhesive lower layer, from the lower face of the shaping carrier, in order to emerge onto the lower conductive pads.

It will be noted that the thickness of the lower conductive pads is the maximum thickness that these pads may have with respect to the lower face of the microelectronic substrate. In other words, irrespectively of the lower conductive pads that extend from the lower face, they are entirely covered by the adhesive layer. This implies that the conductive vias pass through not only the shaping carrier, but also the adhesive lower layer, in order to make contact with the lower conductive pads.

The following are certain preferred but non-limiting aspects of this process.

The lower conductive pads may be placed on an isoline of a lower face of the microelectronic component, the isoline being predetermined as being a line of equidistance to the lower face of the shaping carrier, when the microelectronic component has been joined to the shaping carrier and is bent with the curvature of the curved surface, the conductive vias having a uniform vertical dimension.

After the bending step, the process comprises a step of joining a handle substrate to the shaping carrier on the side of the curved surfaces, so as to allow the stack thus obtained to be handled in the step of producing the conductive vias.

The handle substrate joined to the shaping carrier may be joined to a free end of sidewalls, which are located between and encircle the curved surfaces.

Each microelectronic component may comprise upper conductive pads located on the upper face of the microelectronic substrate, and conductive vias passing through the latter in order to emerge onto the lower face of the microelectronic substrate, so as to encircle the isoline.

The lower conductive pads may be placed in contact with conductive vias of the microelectronic components, or may be offset with respect to these conductive vias and are connected thereto by conductive lines.

During production of the microelectronic structure, the process may comprise an operation of joining a temporary handle substrate to the microelectronic substrate on the side of its upper face.

The process may comprise a step of thinning the microelectronic substrate, from its lower face opposite the temporary handle substrate joined to the microelectronic substrate.

After the transferring step and before the bending step, the temporary handle substrate joined to the microelectronic substrate may be removed from each microelectronic component.

The shaping substrate may be a single piece of a given material.

The shaping substrate may be made of a thermally conductive material.

The microelectronic components may be optical components for emitting or detecting light radiation.

In the step of transferring the microelectronic components to the shaping carrier, the microelectronic components may all be joined to the same temporary handle substrate. The step of transferring the microelectronic components to the shaping carrier may then be carried out so that the microelectronic components rest on and adhere to, via a bearing region of their lower face, an upper surface of sidewalls of the shaping carrier that encircle the curved surfaces. A step of removing the handle substrate may then be carried out. A step of bending the microelectronic components may then be carried out, so that they are bent, and adhere to the curved surfaces via the intermediate adhesive layer, the latter then making contact with the lower face of each microelectronic component and with the corresponding curved surface.

The process may comprise, before the step of removing the temporary handle substrate joined to the microelectronic components, increasing temperature to a first temperature comprised in a temperature range of cross-linkage of the intermediate adhesive layer, then, during or after the bending step, increasing temperature to a second temperature comprised in the cross-linkage temperature range and above the first temperature.

BRIEF DESCRIPTION OF THE DRAWINGS

Other aspects, aims, advantages and features of the invention will become more clearly apparent on reading the following detailed description of preferred embodiments thereof, which description is given by way of non-limiting example with reference to the appended drawings, in which.

DETAILED DISCLOSURE OF PARTICULAR EMBODIMENTS

In the figures and in the remainder of the description, the same references have been used to designate identical or similar elements. In addition, the various elements have not been shown to scale so as to improve the clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean that the bounds are included, unless indicated otherwise.

The invention relates to a process for collectively bending microelectronic components. The latter are obtained from the same functionalized substrate, i.e. they are initially produced using a wafer-level-packaging (WLP) approach. Moreover, at the end of the bending process, each assembly formed from one microelectronic component joined to its shaping and electrically interconnecting carrier has lateral dimensions of the same order as those of the microelectronic component itself. Thus, the process according to the invention is a member of the family of processes of WLCSP type.

In the case of the invention, a microelectronic component comprises an integrated circuit that may comprise active microelectronic elements such as transistors or diodes, and/or active optoelectronic elements such as light-emitting diodes or photodetectors. The microelectronic components are produced from the same semiconductor substrate (wafer).

In the rest of the description, the microelectronic components are optical components (but they may obviously be microwave components, or even MEMS, inter alio). Generally, the latter may be front-side illuminated (FSI) or back-side illuminated (BSI), depending on whether or not the light radiation of interest passes through an interconnect layer of back-end-of-line (BEOL) type of the optical component. However, the terms "FSI" and "BSI" must be understood here with a broad meaning: the optical component may thus be intended to emit or detect light radiation of interest. In the examples illustrated below, the optical components are arranged in a matrix array (but may not be), and each comprise a matrix array of photodiodes associated with a matrix array of micro-lenses. Moreover, the microelectronic components may be an assembly formed from an optical substrate comprising diodes suitable for emitting or receiving light radiation, and for example made based on a IV, III-V or II-VI compound, hybridized with a microelectronic substrate comprising an integrated circuit for controlling/reading the diodes.

Figure 1A:
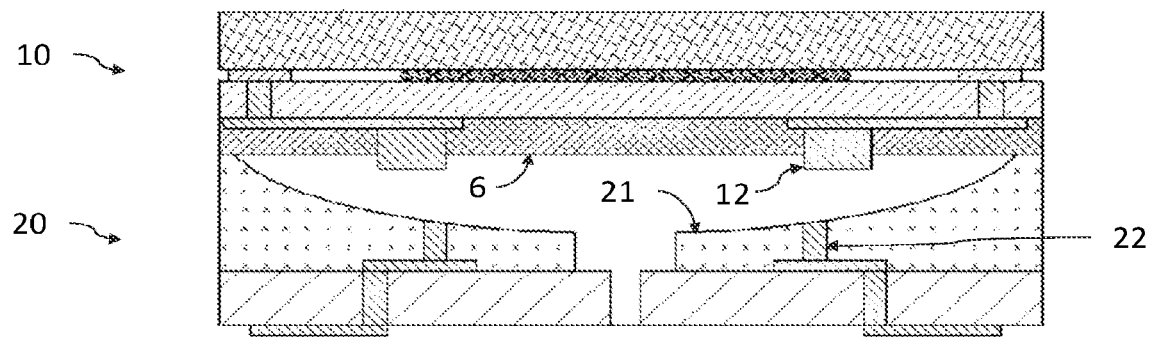
FIGS. 1A and 1B, which have already been described, are schematic and partial cross-sectional views of a microelectronic component transferred to a shaping carrier, before (FIG. 1A) and after (FIG. 1B) it has been bent, using a wafer-level bending process according to one example of the prior art.
Figure 1B:
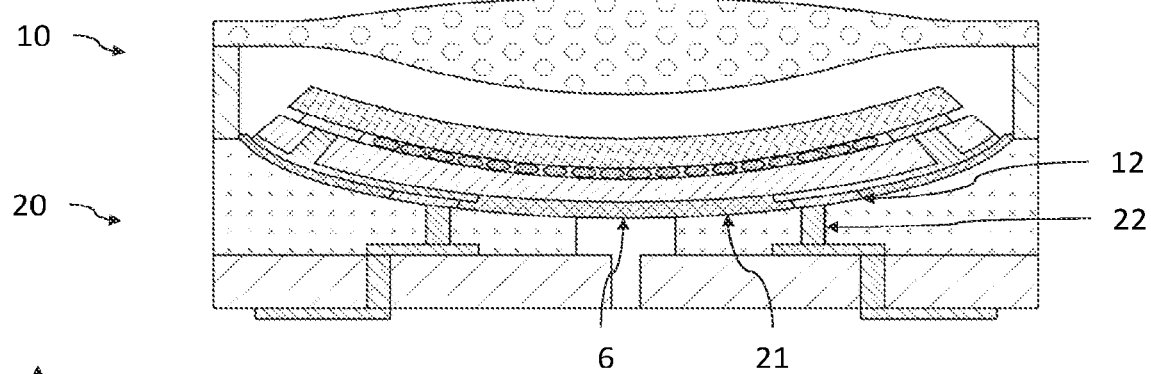
Figure 2A:
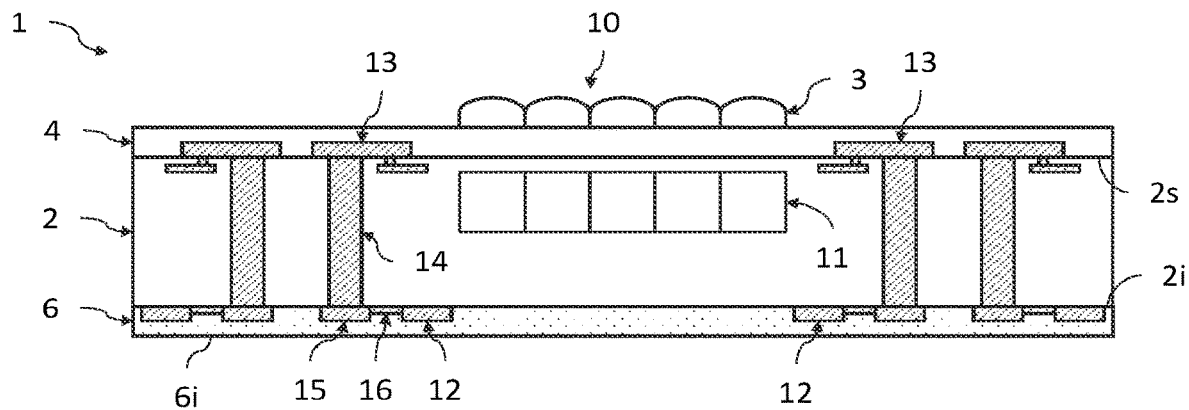
FIG. 2A is a schematic and partial cross-sectional view of a microelectronic structure comprising a plurality of optical components of front-side-illuminated (FSI) type, produced on the wafer level, in the context of a bending process according to one embodiment.

FIG. 2A is a schematic and partial cross-sectional view of a microelectronic (here optoelectronic) structure 1 comprising optical components 10 intended to be collectively bent using a process according to one embodiment of the invention. In this example, the optical components 10 have an FSI configuration.

An orthogonal three-dimensional direct coordinate system XYZ, in which the X-axis and Y-axis form a plane parallel to the upper face of an optical substrate 2, and in which the Z-axis is oriented from the lower face 2i to the upper face 2s of said substrate, is defined here and will be referred to in the rest of the description. In the remainder of the description, the terms "lower" and "upper" will be understood to relate to positions of increasing distance in the +Z-direction.

The optoelectronic structure 1 comprises a functionalized semiconductor substrate 2, referred to as the optical substrate, an adhesive lower layer 6, and here a matrix array of micro-lenses 3 that is joined to the optical substrate 2 by an insulating upper layer 4. The optoelectronic structure 1 is intended to from a plurality of optical components 10.

The optical substrate 2 has an upper face 2s intended here to receive light radiation of interest and an opposite lower face 2i. It may have a thickness of the order of a few tens to one hundred microns, and for example a thickness comprised between 20 μm and 150 μm. In this example, the optical components 10 are CMOS imagers, the optical substrate 2 thus being a thick substrate made for example based on silicon. As a variant, the optical components 10 may be CCD sensors.

The optical substrate 2 comprises, for each optical component 10, a matrix array of photodiodes 11, which are for example produced via local ion implantation of dopants into the silicon of the optical substrate 2. In this FSI configuration, a interconnect layer (BEOL) lies flush with the upper face 2s. It allows the photodiodes 11 to be controlled or read (powered). It is therefore intended to be electrically connected to an external electrical circuit (not shown). The interconnect layer comprises conductive, metal for example, line segments that are separated from one another by a dielectric (for example an oxide and/or nitride of silicon, depending on the wavelength of the light radiation of interest).

Each optical component 10 here comprises upper conductive pads 13 that rest on the upper face 2s of the optical substrate 2, lower conductive pads 12 that rest on the lower face 2i, and conductive vias 14 (here through-silicon vias (TSVs)) that connect the lower conductive pads 12 and the upper conductive pads 13. The upper conductive pads 13 are connected to the interconnect layer, and the lower conductive pads 12 are each connected to the conductive vias 14 here by way of a conductive line 16 and of an intermediate conductive pad 15. Thus, electrical connection of the lower conductive pads 12 allows the various required functions (biasing, supply, processing of the input/outputs, grounding, etc.) to be performed. As a variant, the lower conductive pads 12 may themselves make contact with the conductive vias 14.

An insulating upper layer 4, made of a dielectric and transparent to the light radiation of interest, covers the upper face 2s and contains conductive lines that emerge onto the pads 13. It is a question of an inter-layer dielectric (ILD). The pads 13 may be segments of a conductive line (here the last conductive line). Other arrangements of the latter are of course possible. Moreover, the optoelectronic structure 1 may also comprise a matrix array of colour filters, antireflection layers, or any other passive optical element.

An adhesive lower layer 6, for example a layer of polymer adhesive, entirely covers the lower face 2i and the lower conductive pads 12 (and here the conductive lines 16 and the intermediate conductive pads 15). It has a lower face 6i that is planar, free (i.e. not coated with another material) and continuous. The lower face 6i is said to be continuous in the sense that it is not passed through by any of the conductive pads 12, 15. The conductive pads 12, 15 therefore do not protrude from this lower adhesive layer 6. From a more formal point of view, it is possible to define a face to be continuous if any two points of this face may be connected to each other by a segment all the points of which belong to the face in question.

Figure 2B:
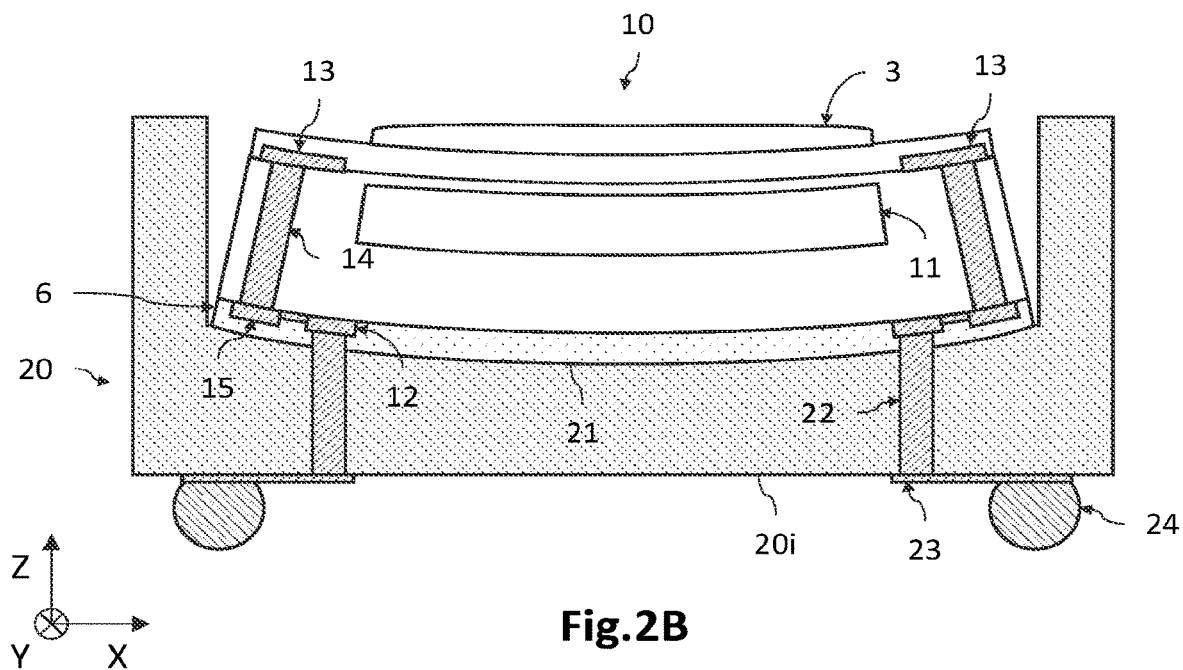
FIG. 2B is a schematic and partial cross-sectional view of the optical component illustrated in FIG. 2A, but shaped and joined to a shaping and interconnecting carrier, in the context of a bending process according to one embodiment.

FIG. 2B is a schematic and partial cross-sectional view of an assembly obtained using the process according to one embodiment of the invention, comprising the optical component 10 illustrated in FIG. 2A, bent and joined to one portion of a shaping and interconnecting carrier 20.

In this figure, as detailed below, the optoelectronic structure 1 has been diced beforehand in order to singulate the optical components 10. Each optical component 10 has been transferred into contact with a curved surface 21 of the shaping and interconnecting carrier 20. The adhesive lower layer 6 allows the optical component 10, then bent, to be joined to the shaping carrier 20.

The shaping and interconnecting carrier 20 performs a dual function: allowing the optical components 10 to be bent collectively, and allowing them to be electrically connected to an external electrical circuit (not shown).

The shaping carrier 20 comprises a plurality of curved surfaces 21 that are intended to receive the optical components 10. The curved surfaces 21 are here concave, but they may be convex or have a more complex curvature. They may have isolines that are circular or oval, or of any other shape. An isoline of a curved surface 21 is a line of equidistance to the lower face 20i of the shaping carrier 20.

In addition, the shaping carrier 20 comprises electrical interconnects that electrically connect the lower conductive pads 12 and external connecting elements 24, here bumps of a meltable material, for example indium or an alloy based on SnAg. To this end, it comprises conductive vias 22 that extend through the shaping carrier 20 and the adhesive lower layer 6, from the lower face 20i, to the lower conductive pads 12. It may also comprise conductive lines 23 that extend over the lower face 20i and that each connect one end of one conductive via 22 to one indium bump 24.

The shaping carrier 20 may be made of one given material, or be formed from a plurality of different materials. The one or more materials are electrically insulating. The carrier 20 may be integrally formed, or formed from a plurality of pieces or thick layers that are added and joined to one another, for example a thick planar layer surmounted by a structured layer. In this example, the shaping carrier 20 is made of one given material, silicon for example.

FIGS. 3A to 3M illustrate various steps of the process for collectively bending optical components 10 that are similar to those illustrated in FIGS. 2A and 2B, according to one embodiment. The matrix arrays of photodiodes 11 and of micro-lenses 3 have been shown in a simplified manner (as in FIG. 2B), for the sake of clarity of the figures. In this example, the optical components 10 are therefore of FSI type, but a BSI configuration is also possible (see FIGS. 5A and 5B).

Figure 3A:
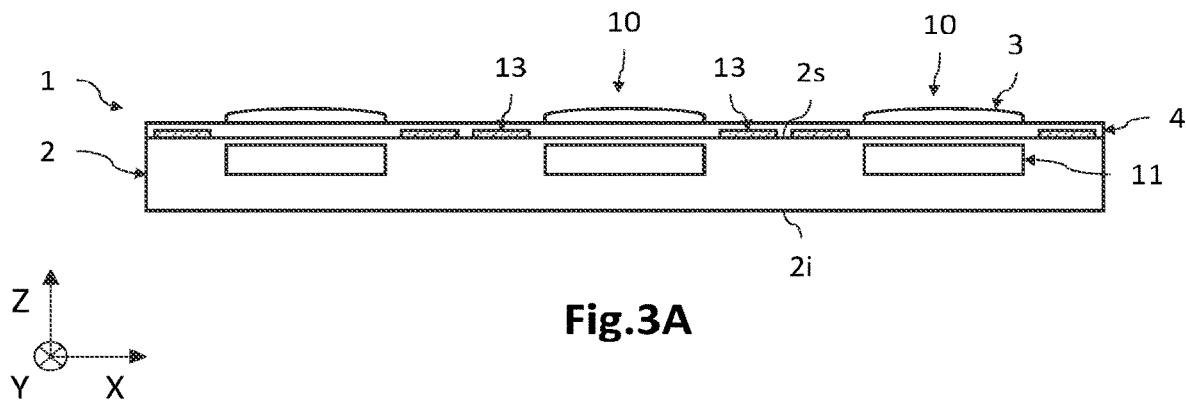
FIGS. 3A to 3M illustrate various steps of one embodiment of a process for collectively bending microelectronic components, here the optical components illustrated in FIG. 2A.

With reference to FIG. 3A, the microelectronic (here optoelectronic) structure 1 is produced. It is a question here of wafer-level production in the sense that a plurality of identical optical components 10 are produced in the same semiconductor substrate (or optical substrate) 2 thus functionalized. Each optical component 10 here comprises a matrix array of photodiodes 11 that are produced in the semiconductor substrate 2. The latter is here made of silicon. Upper conductive pads 13 are here placed on the upper surface 2s and are connected to the interconnect layer (not shown) ensuring the electrical connection of the photodiodes 11. The upper face 2s is here covered with an insulating upper layer 4. This insulating upper layer 4 covers the upper conductive pads 13.

Figure 3B:
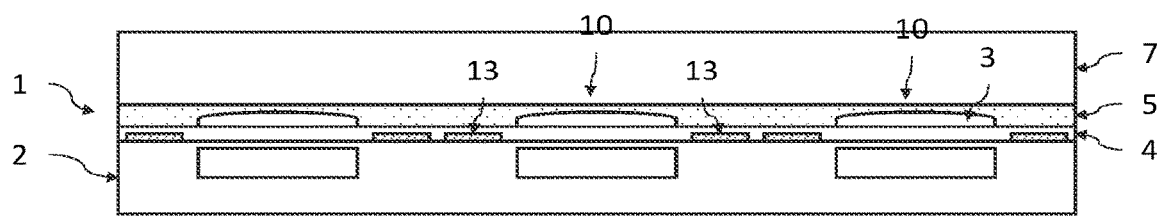

With reference to FIG. 3B, an adhesive upper layer 5 is deposited so as to cover the optical substrate 2. In this example, this layer 5 extends over and makes contact with the insulating upper layer 4 and the micro-lenses 3. It has a planar upper face. This adhesive layer may be temporary, and for example merely used to join a temporary handle substrate 7 allowing the optical substrate 2 to be thinned, then the optical components 10 to be handled. It may be made of a thermoplastic, such as the material HT1010 sold by Brewer Science. Next, the handle substrate 7 is joined to the free face of the adhesive upper layer 5. The handle substrate 7 is a rigid substrate, for example made of silicon or of glass.

Figure 3C:
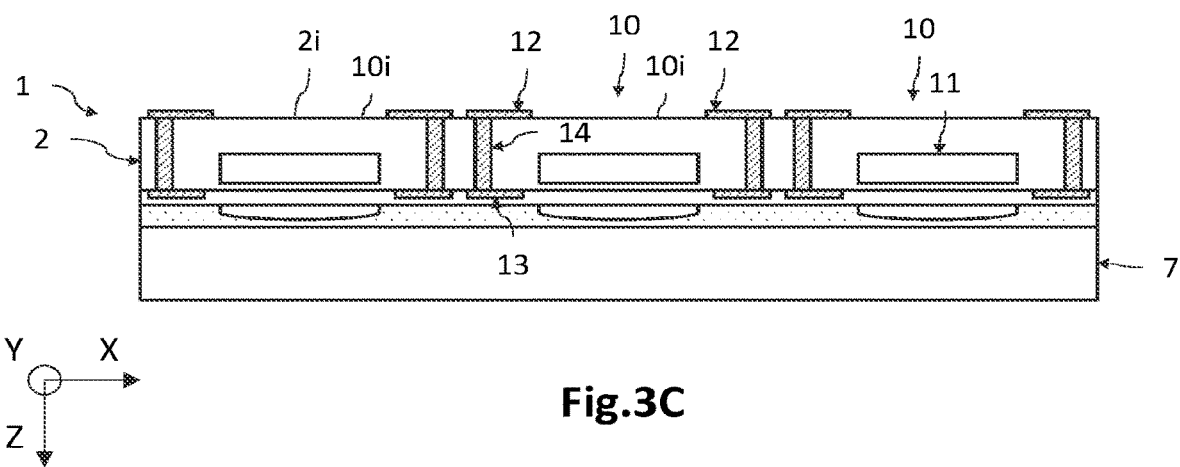

With reference to FIG. 3C, the stack thus obtained is flipped, then the optical substrate 2 is thinned from its lower face 2i, for example by mechanical polishing optionally in the presence of a solution containing abrasive particles, the thinning then being finished by chemical-mechanical polishing, chemical etching, plasma etching in a fluorine-containing chemistry, inter alia. The optical substrate 2 then has a final thickness of the order of 20 µm to 150 µm, this permitting the optical components 10 to be bent while preserving their mechanical properties.

Next, the electrical interconnects that allow an electrical connection to be made to the matrix arrays of photodiodes 11 of the optical components 10 are produced. Beforehand, the optical substrate 2 is thinned from its lower face 2i, for example by mechanical polishing optionally in the presence of a solution containing abrasive particles, the thinning then being finished by chemical-mechanical polishing, chemical etching, plasma etching in a fluorine-containing chemistry, inter (ilia. The optical substrate 2 then has a final thickness of the order of 20 µm to 150 µm, this permitting the optical components 10 to be bent while preserving their mechanical properties.

Next, conductive vias 14 that extend through the optical substrate 2 from the lower face 2i to emerge onto the upper conductive pads 13 are produced. Next, the following are produced: the lower conductive pads 12 on the lower face 2i, and, in this example, intermediate conductive pads 15 located in contact with the conductive vias 14, and conductive lines 16 connecting the lower conductive pads 12 to the intermediate conductive pads 15 (the intermediate conductive pads 15 and the conductive lines 16 are illustrated in FIG. 3E). The conductive pads 12, 15 may be made of one or more electrically conductive materials, metals for example. As detailed in FIG. 3E, the lower conductive pads 12 are here advantageously arranged along an isoline of the lower face 10i of each optical component 10 (the lower face 10i is identical to the lower face 2i). An isoline 10n of the lower face 10i is defined as being, when the optical component 10 has been joined to the shaping carrier 20 and bent with the curvature of the curved surface 21, a line of equidistance to the lower face 20i of the shaping carrier 20.

Figure 3D:
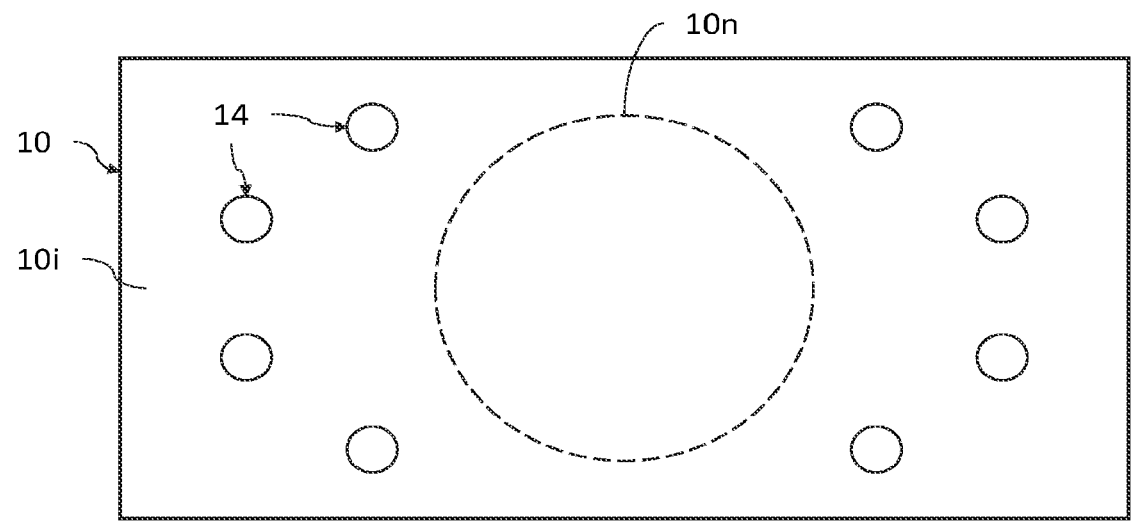
Figure 3E:
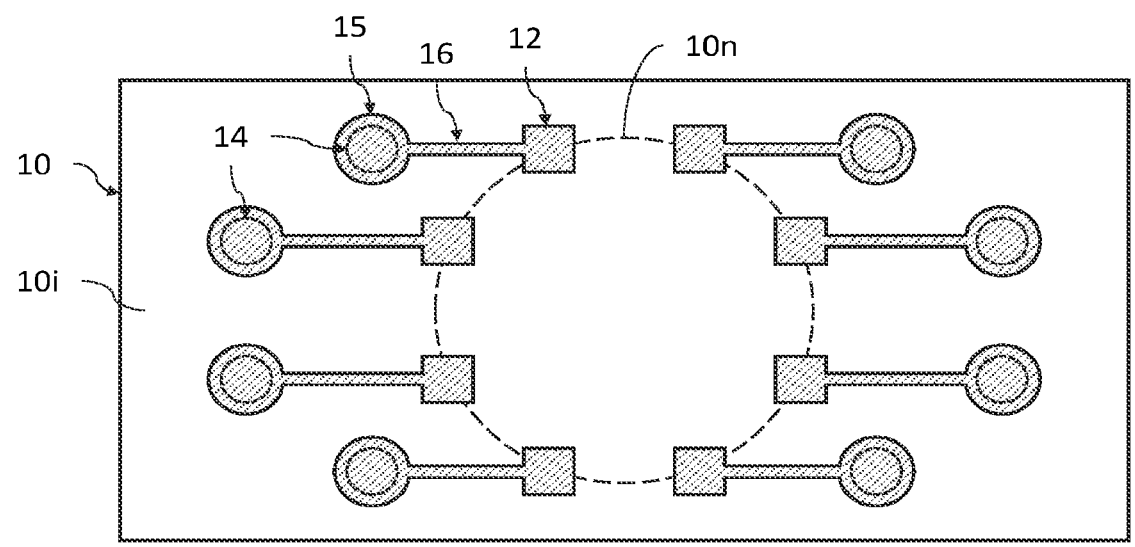

FIG. 3D thus illustrates the lower face 10i of one of the optical components 10. The lower orifices of the conductive vias 14 have been shown therein. They are here arranged around and outside an isoline (dashed line) of the optical component 10. This isoline 10n is defined beforehand depending on the position and on the curvature that the optical component 10 is intended to have when it is joined to the shaping carrier 20. In this example, the isoline 10n is circular, but it could have another shape.

FIG. 3E illustrates the same lower face 10i of the optical component 10, on which face the lower conductive pads 12, the conductive lines 16 and the intermediate conductive pads 15 have been produced. The intermediate conductive pads 15 are located in contact with the conductive vias 14. The lower conductive pads 12 are located on the isoline 10n. The conductive lines 16 connect the intermediate conductive pads 15 to the lower conductive pads 12.

The fact that the lower conductive pads 12 are advantageously located along the isoline 10n allows the conductive vias 22 of the shaping carrier 20 to be produced after the optical component 10 has been joined to the shaping carrier 20, and not before this step, and hence they may all have a uniform vertical dimension, i.e. the same height, without running the risk of degrading the optical components 10.

It will be noted that this arrangement of the intermediate conductive pads 15 and of the lower conductive pads 12 is given by way of illustration. Other arrangements are possible. Thus, the electrical interconnects may not comprise conductive lines 16. The conductive vias 14 of the optical component 10 may therefore emerge directly onto the lower conductive pads 12, which therefore extend so as to be at least partially located on the isoline.

Figure 3F:
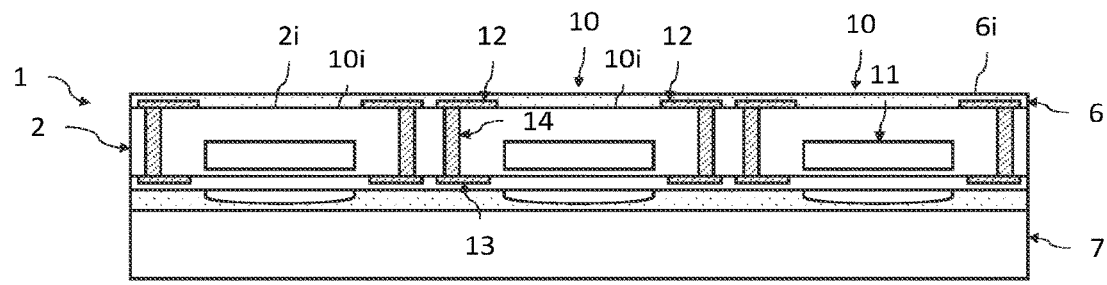
Figure 3F:
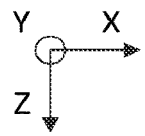

With reference to FIG. 3F, the lower face 2i of the optical substrate 2 is entirely covered with an adhesive lower layer 6. The latter therefore also entirely covers the conductive lines 16 and the lower conductive pads 12 and intermediate conductive pads 15. Specifically, the adhesive lower layer 6 has a thickness larger than that of the lower conductive pads 12 (and where appropriate, as here, of the lines 16 and pads 15). Its lower face 6i is thus continuous, and therefore not passed right through by the intermediate conductive pads 15 and lower conductive pads 12, which would otherwise protrude from this layer 6. It is a permanent adhesive layer, in so far as it will allow the optical components 10 to be joined to the curved surfaces 21 of the shaping carrier 20. The adhesive lower layer 6 may be an epoxy adhesive, a two-component epoxy adhesive for example. It may be selected from the EPO-TEK® adhesives H20S, H20E, H70S. It may also be a question of one of the following adhesives: Araldite 2011, Loctite Hysol K0111, Loctite Ablestik QMI516, Kyocera CT285-2 and Kyocera CT285-F, Creative Materials 118-06F and 122-07(SP), etc. inter alia.

Unlike document US2009/0115875A1 cited above, the lower conductive pads 12 do not protrude with respect to the adhesive lower layer 6, and it is therefore not necessary for them to deform to allow the optical component 10 to be bent and bonded to the curved surface 21. As a result, the actual curvature of the optical component 10 is then as close as it possibly can be to the sought-after curvature (defined by that of the curved surface 21).

Figure 3G:
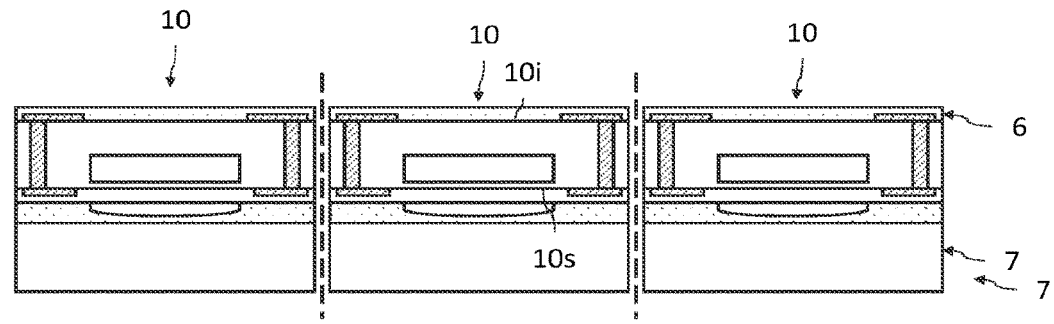

With reference to FIG. 3G, the obtained stack is diced so as to singulate the optical components 10, along predefined dicing lines. Thus, a plurality of optical components 10, which are separate from one another, and which are each joined to one portion of the handle substrate 7 via their upper face 10s, and which comprise a segment of the adhesive layer 6 on their lower face 10i, are obtained. The presence of the handle substrate 7 allows the obtained stack to be handled and divided without running mechanical risks as regards the optical components 10.

Figure 3H:
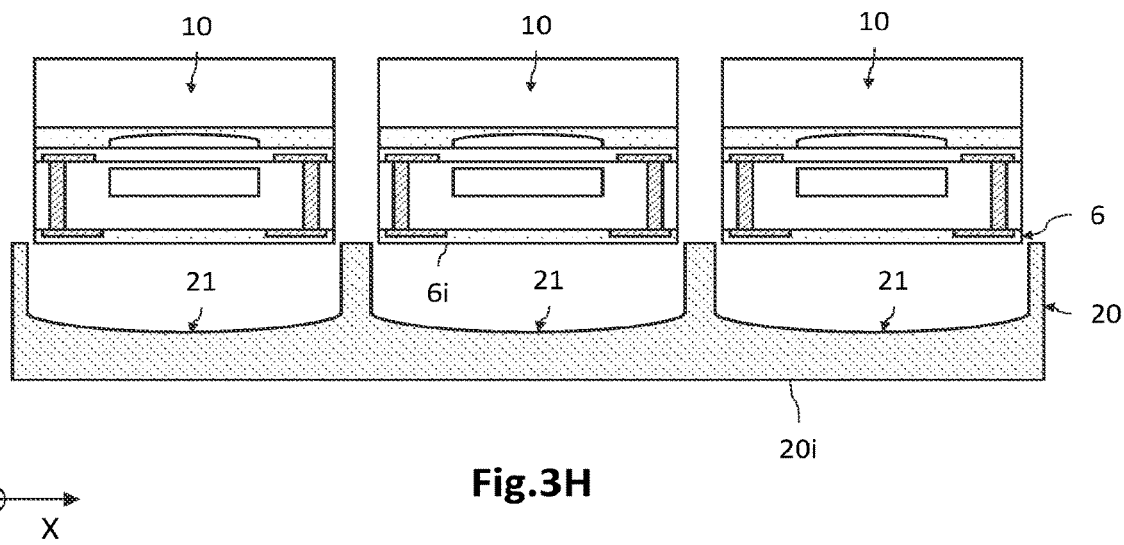
Figure 3H:
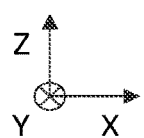

With reference to FIG. 3H, the optical components 10 are placed facing the curved surfaces 21 of the same shaping carrier 20. This step may be carried out collectively, or individually (optical component by optical component).

In this example, the shaping carrier 20 therefore comprises a plurality of curved surfaces 21, here of concave shape, which surfaces are separated pairwise by spacers taking the form of sidewalls 25 that are intended to subsequently allow a second handle substrate 8 to be joined (see FIG. 3K). It comprises a planar lower face 20i, opposite to the curved surfaces 21. In this example, the shaping carrier 20 is one piece of one material, here silicon for example. It may be made of a thermally conductive material in order to permit a better removal of the heat produced by the optical components 10 in operation.

Figure 4:
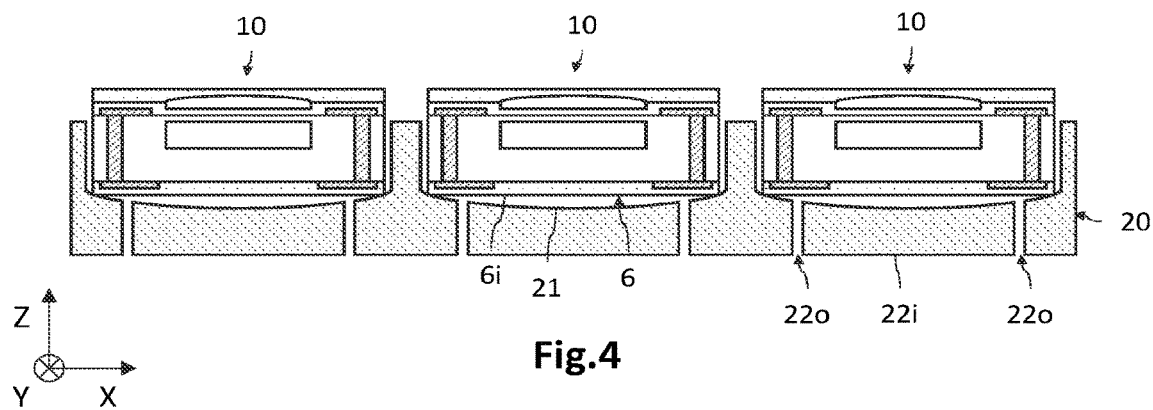
FIG. 4 is a schematic and partial cross-sectional view of optical components that are identical to those illustrated in FIG. 2A, and that have been transferred to a shaping carrier according to one variant embodiment.

At this stage of the process, unlike in document US2009/0115875A1 cited above, the shaping carrier 20 is not passed right through by the conductive vias 22, which would otherwise emerge onto the curved surfaces 21. As illustrated in FIG. 4, through-orifices 22o may however have already been produced. However, they are not yet filled with a conductive material, and may thus participate in the generation of the curvature of the optical components 10 via removal of the gas present in the space located between the lower face of the adhesive lower layer 6 and the curved surface 21. It will be noted that the shaping carrier 20 may also comprise through-orifices located at the centre of the curved surfaces 21, these through-orifices possibly being identical or similar to those described in document US2009/0115875A1.

Figure 3I:
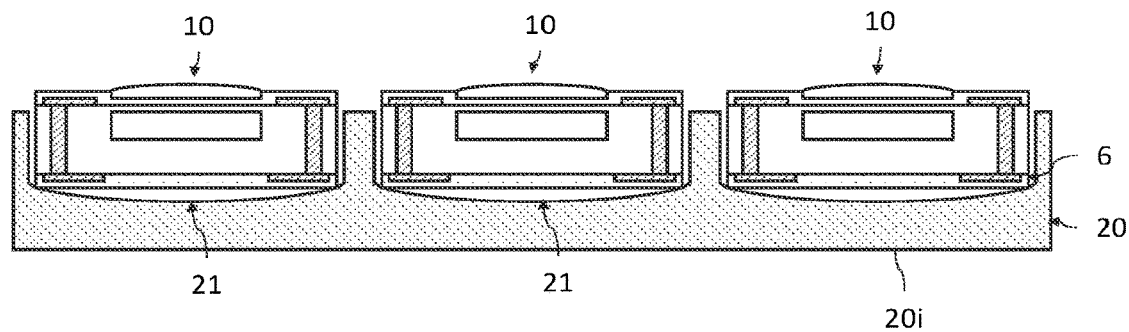

With reference to FIG. 3I, the optical components 10 are brought into contact with the shaping carrier 20. Thus, one portion of the adhesive lower layer 6 locally makes contact with a peripheral portion of the curved surface 21. Shaping has not yet occurred at this stage. Next, the handle substrate 7 is removed from each optical component 10, via a heat treatment, a chemical treatment or a mechanical process. The upper adhesive layer 5 may also be removed.

Figure 3J:
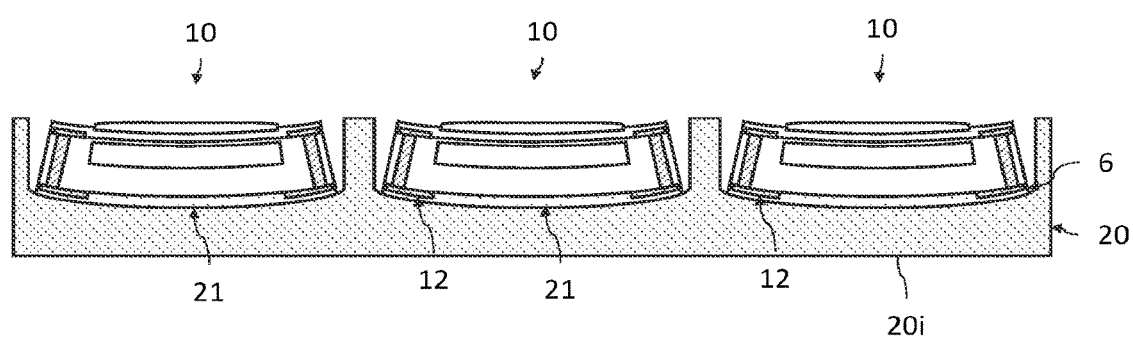

With reference to FIG. 3J, the optical components 10 are collectively shaped, so that the adhesive lower layer 6 makes contact with the curved surface 21. To this end, a pressure is applied to each of the optical components 10, for example using a pressing tool (not shown) or using a technique described in document EP3480850A1, simultaneously. Temperature may also be increased, at least to the temperature of polymerization of the adhesive, where appropriate. Each optical component 10 deforms and adopts the curvature imposed by the corresponding curved surface 21. Thus, a plurality of optical components 10, all bent with the sought-after curvature, and all joined to the same shaping carrier 20, are obtained.

It will be noted here that the adhesive lower layer 6 is not passed right through by the lower conductive pads 12 and intermediate conductive pads 15, which would otherwise protrude. Shaping is therefore not disrupted by such protruding pads, and hence the optical components 10 may then achieve the sought-after curvature (that of the curved surfaces 21).

Figure 3K:
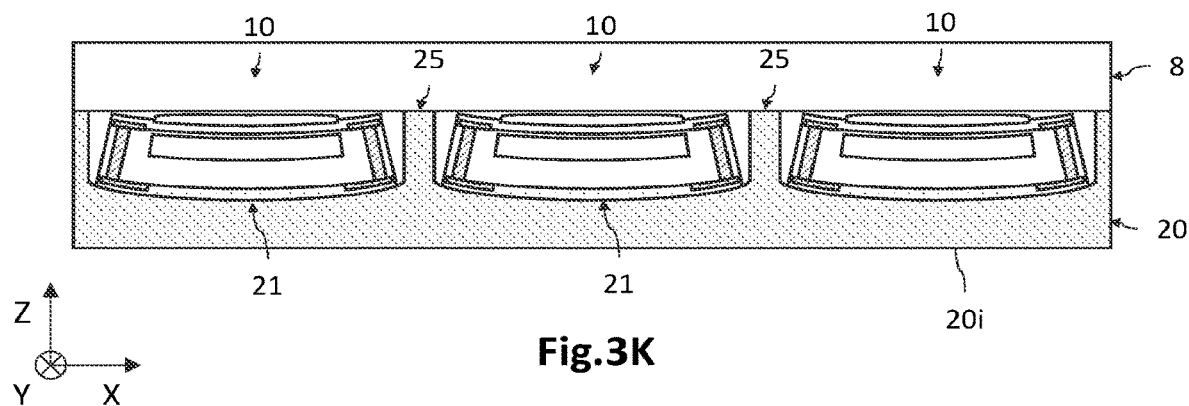

With reference to FIG. 3K, the stack thus obtained is joined to a handle substrate 8, which allows the stack to be handled in the step of producing the electrical interconnects in the shaping carrier 20. To this end, the handle substrate 8 is joined to the free end of the sidewalls 25. A layer of adhesive (not shown) may be used in this step. The handle substrate 8 may be a temporary handle (one made of silicon for example), notably when it is not transparent to the light radiation of interest, or may be a permanent handle (one made of glass for example) and serve as transparent protective cover opposite each optical component 10.

Figure 3L:
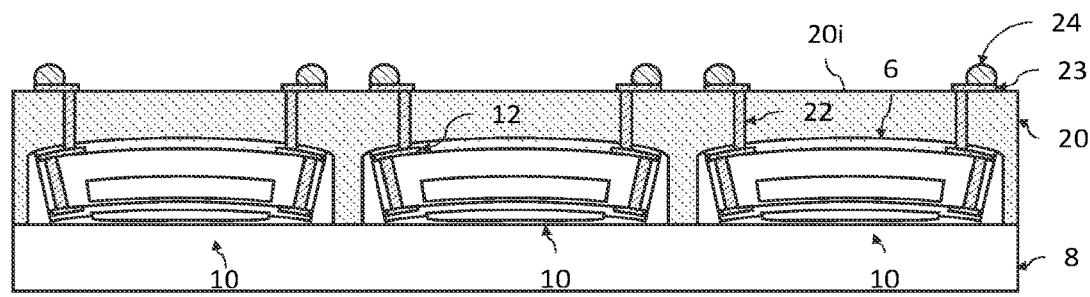

With reference to FIG. 3L, the obtained stack is flipped, and electrical interconnects are produced in the shaping carrier 20. These allow an external electrical circuit (not shown) and the matrix arrays of photodiodes to be electrically connected via the electrical interconnects of each optical component 10.

Thus, conductive vias 22 that extend through the shaping carrier 20 and adhesive lower layer 6, from the lower face 20i, to emerge directly onto the lower conductive pads 12, are produced. To this end, the through-orifices are produced simultaneously so that they will have the same height. In so far as they emerge onto the lower conductive pads 12, which are located on the isolines of the lower faces 10i thus bent with the curvature imposed by the curvature of the curved surfaces 21, there is no risk of production of the through-orifices degrading the optical components 10. Next, the conductive vias 22 are produced by at least partially filling the through-orifices with an electrically conductive material.

The electrical interconnects of the shaping carrier 20 may also comprise, as illustrated in this example, conductive lines 23 that extend over the lower face 20i. It is also possible to produce elements 24 connecting to an external electrical circuit (not shown), which is for example located on a printed circuit board (PCB). It is here a question of bumps made of a meltable material such as indium.

Figure 3M:
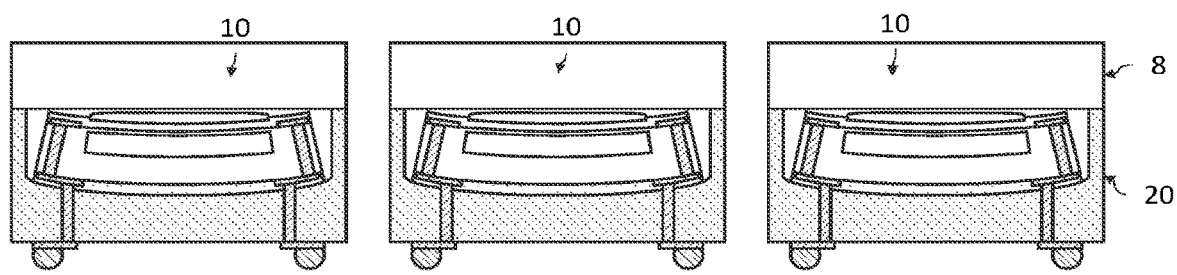

With reference to FIG. 3M, the stack thus obtained is diced to singulate the optical components 10. In this example, the handle substrate 8 forms a permanent cover in so far as it is made of a material that is transparent to the light radiation of interest. As a variant, it may be removed, before or after this dicing operation. A transparent cover may optionally be joined to the various optical components 10.

Thus, the collectively bending process allows a plurality of bent optical components 10 that are joined to one portion of the same shaping and electrically interconnecting carrier 20 to be obtained. In so far as the adhesive lower layer 6 has a thickness larger than those of the conductive pads 12 (and where appropriate of the lines 16 and pads 15), its lower face 6i is continuous (and hence the conductive pads do not protrude), and the optical components 10 may actually have the sought-after curvature. In addition, the conductive vias 22 are produced after bending and joining, and advantageously have the same height. To ensure a good electrical connection without running the risk of degrading the optical components, the conductive vias emerge onto the lower conductive pads 12, which are then advantageously located on an isoline of the bent lower face 10i of the optical components 10.

FIG. 4 is a schematic and partial cross-sectional view of a step of a collectively bending process according to one variant embodiment.

Here, the through-orifices 22o of the conductive vias 22 are produced in the shaping carrier 20 before the step of transferring and joining the optical components 10. Thus, the through-orifices 22o extend through the shaping carrier 20, from the lower face 20i to the curved surfaces 21. Thus, these through-orifices 22o may play a role in bending the optical components 10. To this end, the gas located in the space bounded by the lower face 6i of the adhesive lower layer 6 and the curved surface 21 is removed in order to assist with bending the optical components 10.

As indicated above, the shaping carrier 20 may comprise at least one additional through-orifice (not shown), for example located at the centre of each curved surface.

The collectively bending process then comprises, after the optical components 10 have been bent and joined to the various curved surfaces 21, a step in which the through-orifices 22o are enlarged so as to make them pass right through the adhesive lower layer 6 and thus emerge onto the lower conductive pads 12. They may then be filled with an electrically conductive material, in order thus to obtain the conductive vias 22.

Figure 5A:
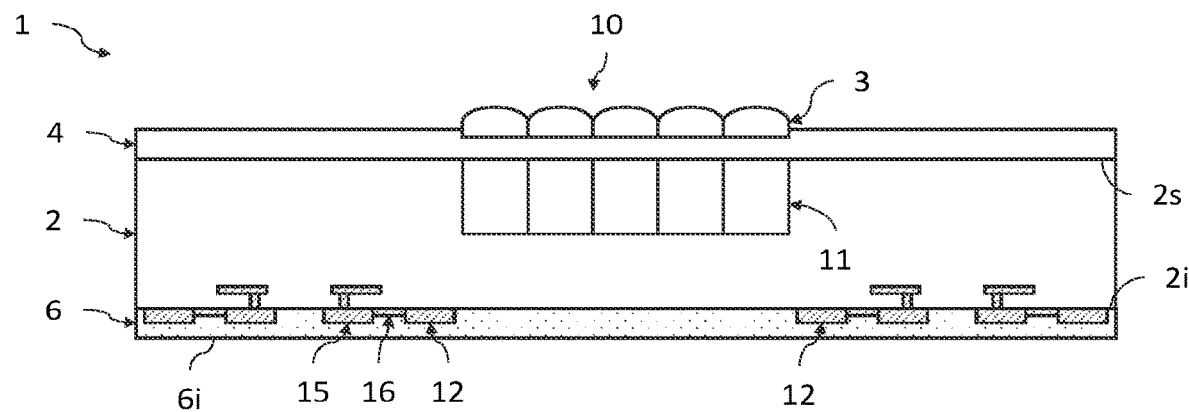
FIG. 5A is a schematic and partial cross-sectional view of a microelectronic structure comprising a plurality of optical components of back-side-illuminated (BSI) type, produced on the wafer level, in the context of a bending process according to one embodiment.

FIG. 5A is a schematic and partial cross-sectional view of an optoelectronic structure 1 comprising optical components 10 intended to be collectively bent using a process according to one embodiment of the invention. In this example, the optical components 10 have a BSI configuration.

The optoelectronic structure 1 is similar to that described above with reference to FIG. 2A, and differs therefrom in that the (BEOL) interconnect layer lies flush with the lower face 2i and not with the upper face 2s of the optical substrate 2. Thus, the optoelectronic structure 1 here comprises, for each optical component 10, only lower conductive pads 12 (ensuring connection to the matrix array of photodiodes via the interconnect layer) and not upper conductive pads 13. There are therefore here no conductive vias 14 passing through the optical substrate 2.

Figure 5B:
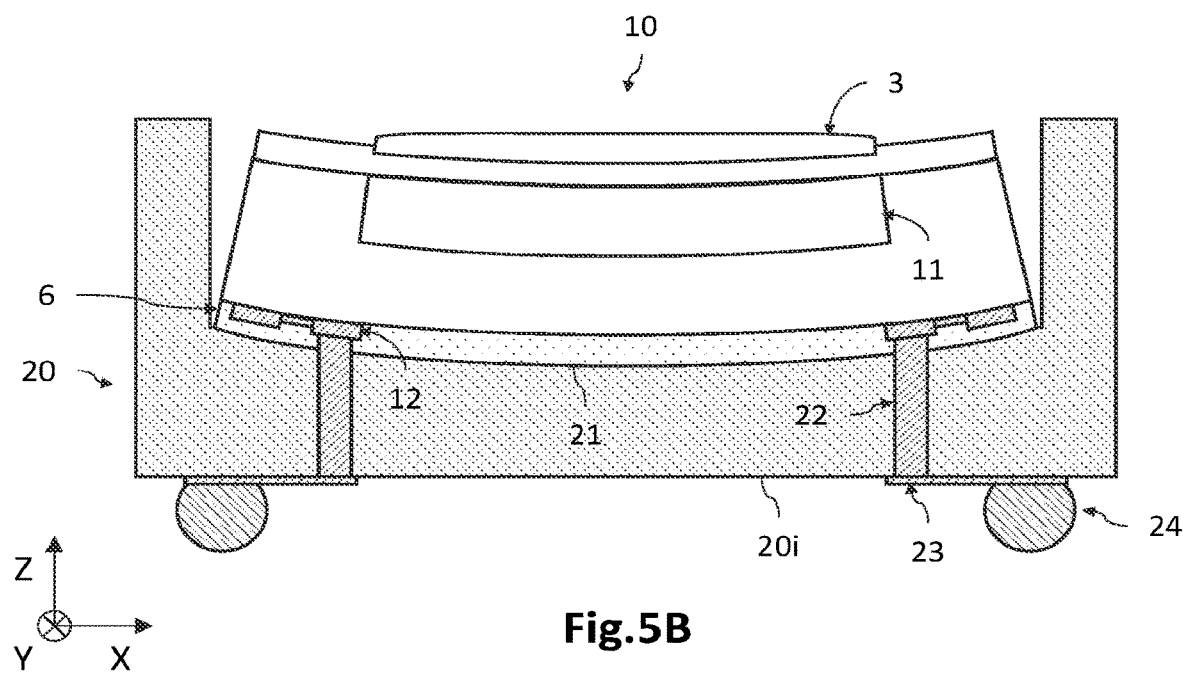
FIG. 5B is a schematic and partial cross-sectional view of the optical component illustrated in FIG. 5A, but shaped and joined to a shaping and interconnecting carrier, in the context of a bending process according to one embodiment.

FIG. 5B is a schematic and partial cross-sectional view of an assembly obtained using the process according to one embodiment of the invention, comprising the optical component 10 illustrated in FIG. 5A, bent and joined to one portion of the shaping and electrically interconnecting carrier 20. The shaping carrier 20 is here identical to that described above, and is therefore not described in detail again.

Figure 6A:
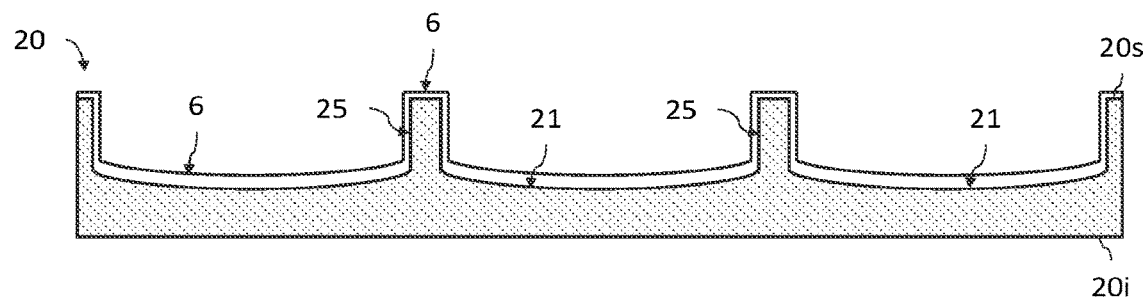
FIGS. 6A to 6C illustrate various steps of one variant embodiment of the process for collectively bending microelectronic components, in which variant embodiment the adhesive lower layer is deposited on the curved surfaces of the shaping carrier.
Figure 6B:
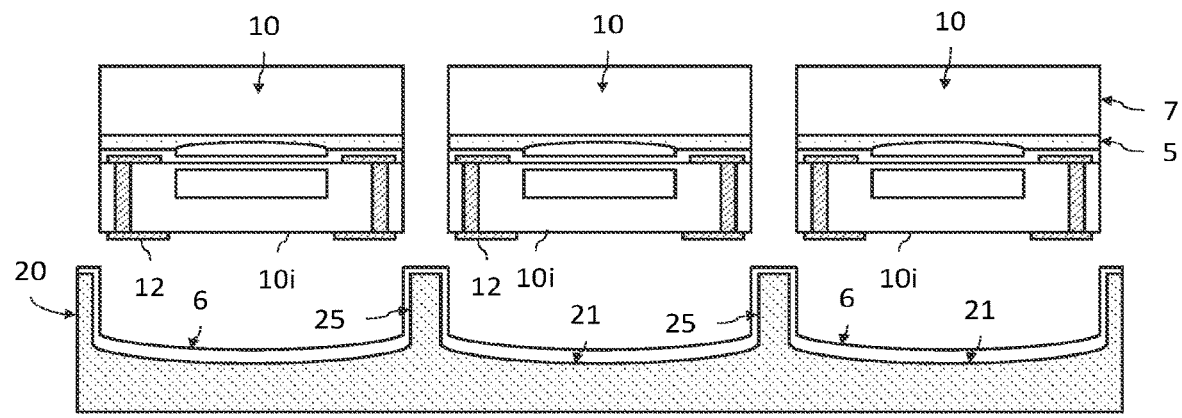
Figure 6C:
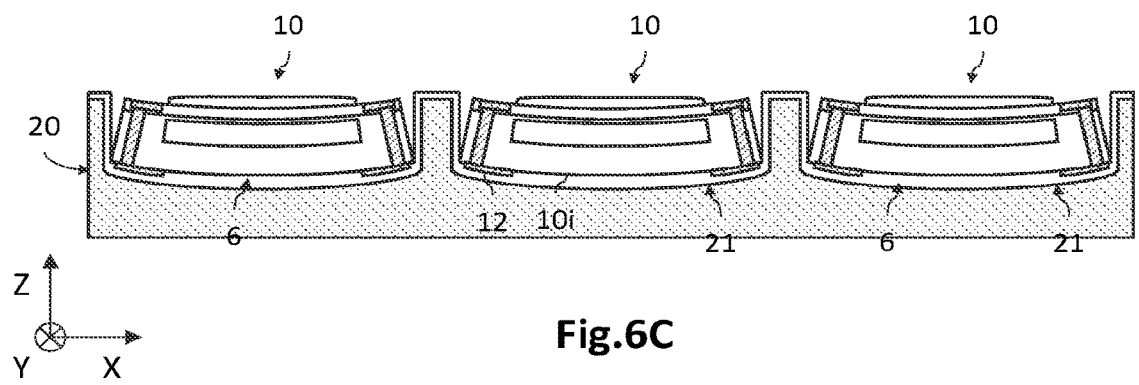

FIGS. 6A to 6C illustrate various steps of a collectively bending process according to one variant embodiment. The process here differs from that illustrated in FIGS. 3A to 3M essentially in that the adhesive lower layer 6 is deposited on the upper face 20s of the shaping substrate 20 and not on the lower face 2i of the optical substrate 2.

Be that as it may, the adhesive lower layer 6 has a thickness larger than that of the lower conductive pads 12. Thus, during bending of the optical components 10, said pads do not therefore "pierce" the adhesive lower layer 6, and hence the actual curvature of the optical components 10 thus bent may correspond to the sought after curvature.

FIG. 6A illustrates the step of depositing the adhesive lower layer 6 on the upper face 20s of the shaping carrier 20. It has a thickness that is preferably uniform over the curved surfaces 21 and over the upper surface of the sidewalls 25. By way of illustration, this thickness may be comprised between 5 µm and 100 µm, and for example be equal to about 60 µm. The intermediate adhesive layer 6 may be deposited by spin coating, by spray coating, screen-printing, roll-coating with a dry film, inter alia.

FIG. 6B illustrates the step of transferring the optical components 10 facing the curved surfaces 21 of the same shaping carrier 20. This step is identical or similar to that described with reference to FIG. 3H.

FIG. 6C illustrates the step of bringing the optical components 10 into contact with the shaping carrier 20 and of shaping them thereon. This step is identical or similar to those described with reference to FIGS. 3I and 3J. First each optical component 10 is brought into contact with the adhesive lower layer 6, and the portions of the handle substrate 7 (and the adhesive upper layer 5) are removed. Next, the optical components 10 are collectively shaped, so that the lower face 10i and the lower conductive pads 12 makes contact with the adhesive lower layer 6. Each optical component 10 deforms and adopts the curvature imposed by the corresponding curved surface 21. Thus, a plurality of optical components 10, all bent with the sought-after curvature, and all joined to the same shaping carrier 20, are obtained.

In so far as the adhesive lower layer 6 has a thickness larger than that of the lower conductive pads 12, the conductive pads 12 do not "pierce" the adhesive lower layer 6 to make direct contact with the curved surfaces 21, and the optical components 10 may therefore actually have the sought-after curvature. The bending process may then continue with steps of structuring the shaping carrier 20, as notably described with reference to FIGS. 3K to 3M.

FIGS. 7A to 7I illustrate various steps of a collectively bending process according to another variant embodiment. This process here differs from that illustrated in FIGS. 6A to 6C essentially in that the optical components 10 are transferred to the shaping carrier 20 on the wafer level, while they are all joined to the same handle substrate 7.

Figure 7A:
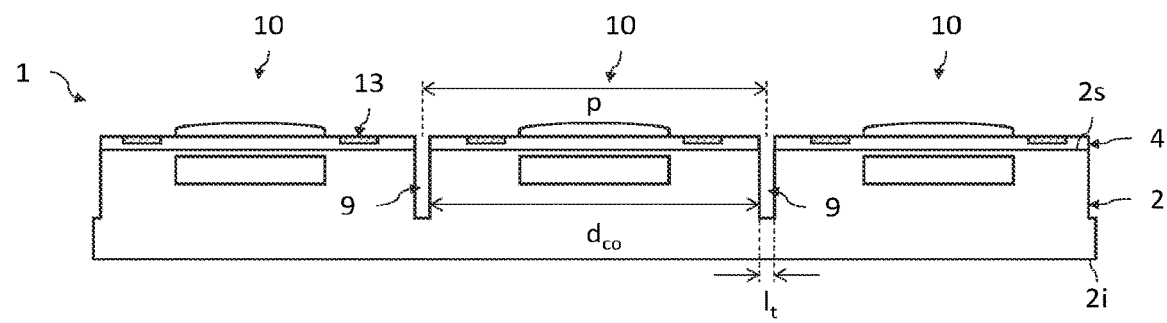
FIGS. 7A to 7I illustrate various steps of one variant embodiment of the process for collectively bending microelectronic components, in which variant embodiment the microelectronic components are joined to the same handle substrate and transferred to the shaping carrier.

FIG. 7A illustrates the production of the initial structure 1 comprising a functionalized semiconductor substrate 2, here the optical substrate. The initial structure 1 also comprises the matrix array of micro-lenses 3, which is joined to the optical substrate 2 by an insulating upper layer 4. The initial structure 1 comprises a plurality of optical components 10, which are intended to be singulated.

Figure 7B:
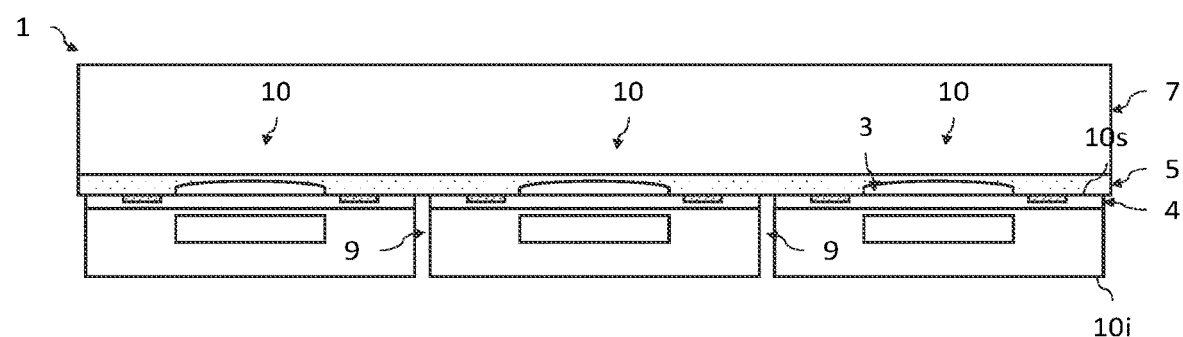

With reference to FIG. 7B, trenches 9 are produced in the initial structure 1, so as to pre-singulate the optical components 10, from their upper face. This step may be carried out by mechanical sawing or by laser etching, so that the trenches pass right through the insulating upper layer 4 and extend through some of the thickness of the optical substrate 2. The trenches 9 are blind grooves that do not emerge onto the lower face 2i. The trenches 9 encircle the optical components 10 and extend to a depth that defines the final thickness of the optical substrate 2, here for example to a depth of the order of 20 µm to 150 µm. They have a width $l_t$ in the XY-plane and extend longitudinally so as to define the shape of the optical components 10 in the XY-plane. This shape may be polygonal, square or rectangular for example, or even circular or oval. In this example, the optical components 10 have a square shape in the XY-plane of side length $d_{co}$. The trenches 9 are spaced apart from one another regularly by the pitch p.

The optical substrate 2 is joined to the temporary handle substrate 7, on the side of the upper face 2s. The handle substrate 7 is made of a rigid material, glass or silicon for example. Here, an upper adhesive layer 5 is deposited so as to cover the optical substrate 2, then the handle substrate 7 is attached.

Next, the optical substrate 2 is thinned from its lower face 2i, for example by mechanical polishing optionally in the presence of a solution containing abrasive particles, the thinning then being finished by chemical-mechanical polishing, chemical etching, plasma etching in a fluorine-containing chemistry, inter cilia. The optical substrate 2 then has a final thickness of the order of 20 µm to 150 µm, this permitting the optical components 10 to be bent while preserving their mechanical properties. The thinning is carried out as much as required to make the trenches 9 through-trenches. Thus, a given structure in which the optical components 10 are separate and distant from one another by the distance $l_t$, while all remaining joined to the handle substrate 7, is obtained. Next, the conductive vias 14 and the lower pads 12 (and lines 16 and pads 15 where appropriate) are produced, as described above (see FIG. 3C for example).

Figure 7C:
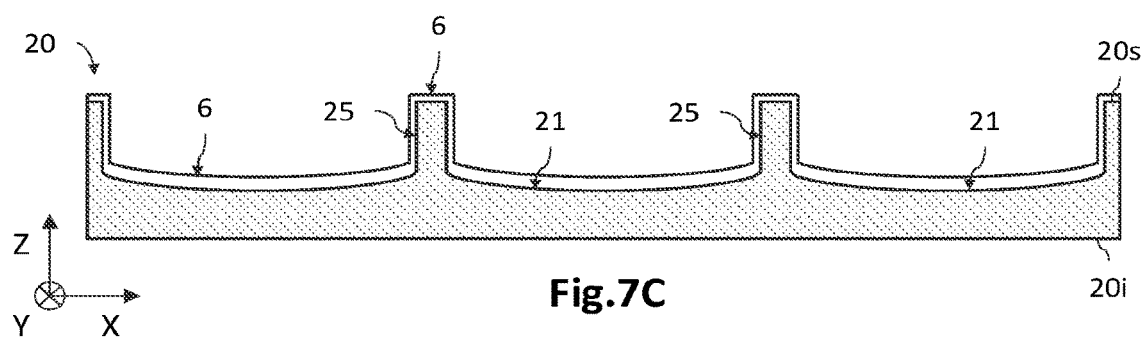

FIG. 7C illustrates the step of depositing the intermediate adhesive layer 6 on the upper face 20s of the shaping carrier 20. It has a thickness that is preferably uniform over the curved surfaces 21. By way of illustration, this thickness may be comprised between 5 µm and 100 µm, and for example be equal to about 60 µm. This thickness is however larger than the thickness of the lower conductive pads 12.

The intermediate adhesive layer 6 may be a polymer adhesive the cross-linkage of which has a wide temperature range, for example comprised between 80° C. and 200° C. It is therefore possible to carry out its cross-linkage in two stages, i.e. to obtain a partial first cross-linkage, allowing the optical components 10 to be held in place on the sidewalls 25 in the step of removing the handle substrate 7, while subsequently permitting said components to be bent collectively, then to carry out a complete or almost complete second cross-linkage allowing the optical components 10, then located against the curved surfaces 21, to be held in place. Such an adhesive may, by way of example, be the adhesive Furukawa AFN-601-60M.

Figure 7D:
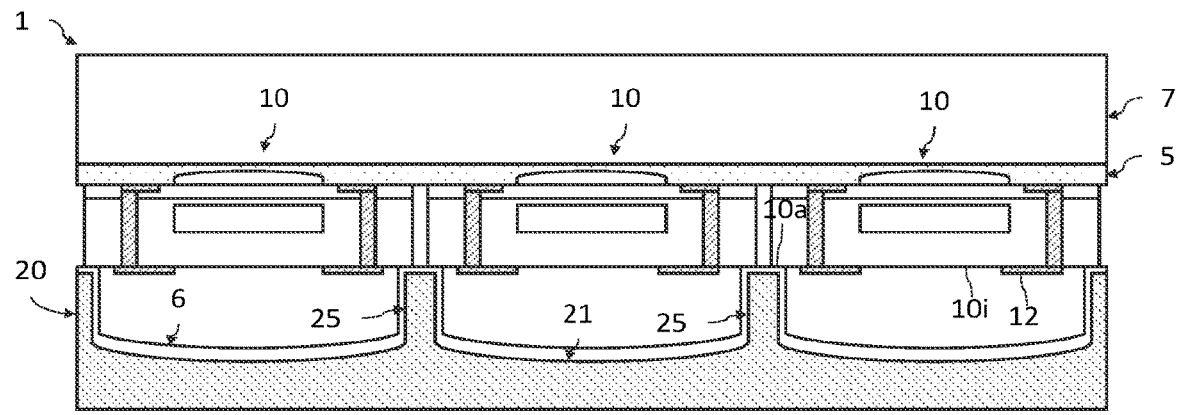

With reference to FIG. 7D, the obtained structure is transferred in the step 7B to the shaping carrier 20, so that the optical components 10 rest on the sidewalls 25. More precisely, the optical components 10 rest on the sidewalls 25 via a peripheral region of their lower face 10i, defining a bearing region 10a. The width of this bearing region 10a, for each optical component 10, is equal to half the difference between the width $l_p$ of the sidewalls 25 and the width $l_t$ of the trenches 9: i.e. to $(l_p-l_t)/2$.

Figure 7E:
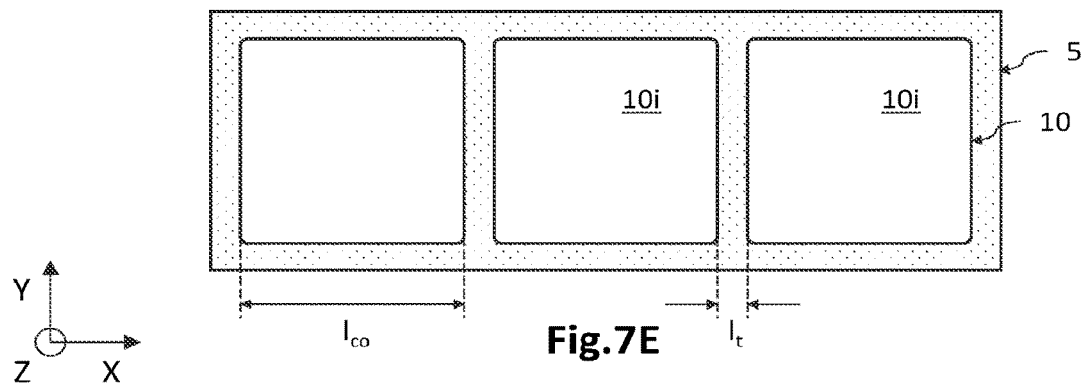

FIG. 7E illustrates the lower face 10i of the optical components 10, separated from one another by the distance $l_t$, and the lower face of the upper adhesive layer 5. In this example, the optical components 10 have a square shape in the XY-plane, of side length $l_{co}$.

Figure 7F:
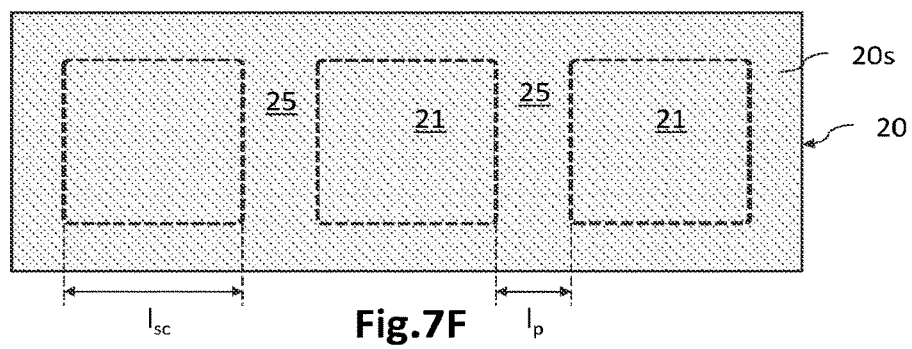

FIG. 7F illustrates the upper face 20s of the shaping carrier 20. In this example, the curved surfaces 21 have a square shape in the XY-plane of side length $l_{sc}$, and a radius of curvature $R_c$ here measured about the X- and Y-axes. The side length $l_{sc}$ is shorter than the side length $l_{co}$. In addition, the sidewalls 25 have a width $l_p$ larger than the width $l_t$ of the trenches 9.

Figure 7G:
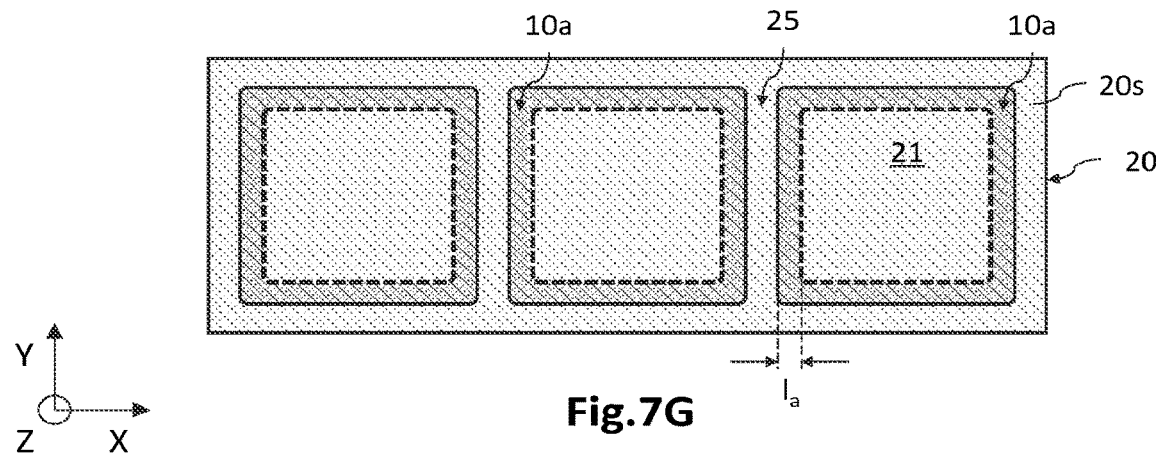

FIG. 7G illustrates the upper face 20s of the shaping carrier 20, to which the optical components 10 have been transferred, and allows the bearing region 10a of the latter on the sidewalls 25 to be seen. The bearing region 10a has a nonzero bearing width $l_a$ equal to $(l_p-l_t)/2$.

Specifically, the process may comprise a prior step of dimensioning the optical components 10 and shaping carrier 20 so that the optical components 10 have a sufficient bearing width $l_a$ in the step of removing the handle substrate 7, while being able to be bent to seat against the curved surfaces 21. It is thus possible to determine a variation in the maximum bearing width $l_{a,max}$ of each optical component 10 on a sidewall 25 depending on the radius of curvature $R_c$ of the curved surface 21. This geometric model allows, on the basis of the width $l_{co}$ of the optical components 10 and of the radius of curvature $R_c$, the maximum bearing width $l_{a,max}$ that the optical components 10 may have to be bendable with the radius of curvature $R_c$ and to be able to seat against the curved surfaces 21, to be deduced.

Moreover, it is considered that the bearing width $l_a$ will preferably be larger than or equal to a limiting value $l_{a,min}$, for example equal to 10 µm, below which the bearing width $l_a$ will be insufficient to ensure the optical components 10 are held. In addition, the radius of curvature $R_c$ will be larger than or equal to a limiting value $R_{c,min}$, for example equal to 70 mm, so as to avoid any degradation of the mechanical properties of the optical components 10 then bent and having the radius of curvature $R_c$. The limiting values $l_{a,min}$ and $R_{c,min}$ may of course be determined case by case.

Thus, knowing the sought-after radius of curvature $R_c$ and the transverse dimension $l_a$ of the optical components 10, it is possible to determine a bearing width $l_a$ comprised between a predefined minimum value $l_{a,min}$ and a maximum value $l_{a,max}$ determined using the geometric model, so that the optical components 10 rest sufficiently on the sidewalls 25, while being able subsequently to be bent with the sought-after radius of curvature $R_c$ without being structurally degraded.

Figure 7H:
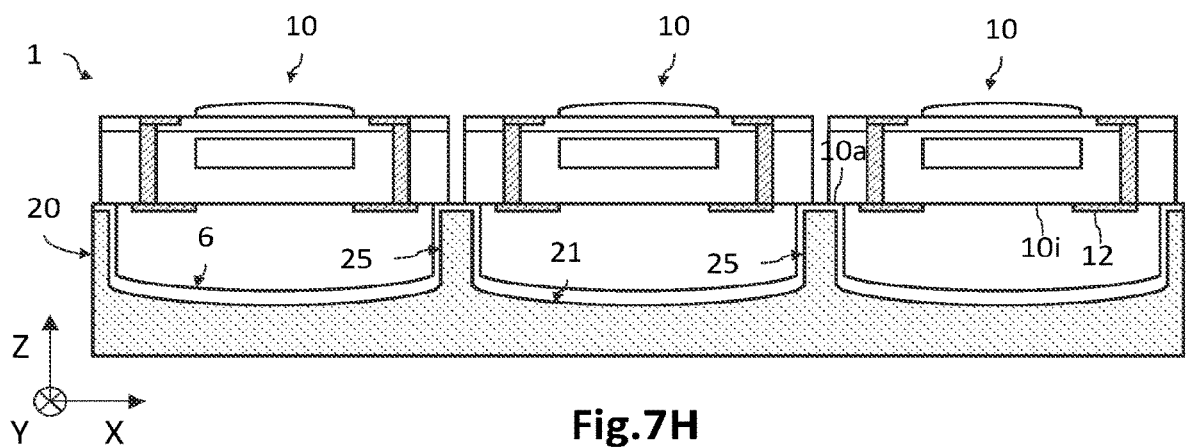

With reference to FIG. 7H, the handle substrate 7 is removed. To this end, before carrying out the removal, it is advantageous to carry out a first cross-linkage of the intermediate adhesive layer 6. This is done by raising the structure to a first temperature $T_1$, referred to as partial cross-linkage temperature, comprised in the cross-linkage temperature range, here comprised between 80° C. and 200° C. This first temperature $T_1$ is below a second temperature $T_2$, referred to as complete cross-linkage temperature, that is applied when the optical components 10 are bent against the curved surfaces 21. Thus, the here partial cross-linkage of the intermediate adhesive layer 6 allows the attachment of the optical components 10 to be improved while subsequently permitting them to be bent.

Figure 7I:
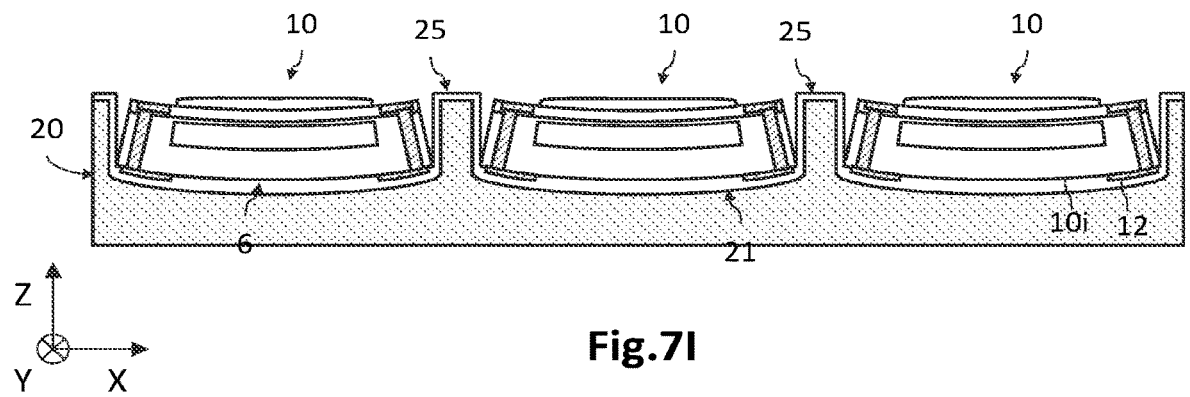

With reference to FIG. 7I, the optical components 10 are then bent collectively. Beforehand, it is advantageous to locally weaken the intermediate adhesive layer 6 in the bearing regions 10a, so as to decrease the, notably shear, mechanical stresses experienced by the intermediate adhesive layer 6 during the bending of the optical components 10. To this end, a laser shot may be applied to the bearing region 10a, for example through the shaping carrier 20 or the trenches 9.

Next, the optical components 10 are bent simultaneously, until their lower face 10i seats against the corresponding curved surface 21, the intermediate adhesive layer 6 then being located between and in contact with the lower face 10i and the curved surface 21. To this end, a pressure is applied to each of the optical components 10, for example using a pressing tool (not shown) simultaneously. Each optical component 10 deforms and adopts the curvature imposed by the corresponding curved surface 21. The optical components 10 then "slide" along the upper face of the shaping carrier 20 until they become seated against the curved surfaces 21. This is possible in so far as the materials of adhesive layers that cross-link during a temperature increase generally have a good mechanical resistance to being "torn away" (this allowing the optical components 10 to be held in place during the removal of the handle substrate 7) but however permit a shear to be undergone (this allowing the optical components 10 to slide during the shaping thereof). Thus, a plurality of optical components 10, all bent with the sought-after curvature, and all joined to the same shaping carrier 20, are obtained.

Temperature may also be increased during or after the bending, to a second cross-linkage temperature $T_2$ of the intermediate adhesive layer 6, this temperature $T_2$ being above the preceding temperature $T_1$, and allowing a more complete cross-linkage to be obtained. The attachment of the optical components 10 to the curved surface 21 is thus improved.

The bending process may then continue with the steps of structuring the shaping carrier 20, as described above. As in the example of FIGS. 6A to 6C, in so far as the adhesive lower layer 6 has a thickness larger than that of the lower conductive pads 12, the conductive pads 12 do not "pierce" the adhesive lower layer 6 to make direct contact with the curved surfaces 21, and the optical components 10 may therefore actually have the sought-after curvature.

Particular embodiments have just been described. Various variants and modifications will seem obvious to anyone skilled in the art.

The invention claimed is:

1. A process for collectively bending microelectronic components comprising the following steps:
   producing a microelectronic structure, comprising a microelectronic substrate, having an upper face and an opposite lower face, comprising a plurality of microelectronic components, each of the plurality of microelectronic components comprises lower conductive pads located on the opposite lower face and intended to allow the plurality of microelectronic components to be connected electrically;
   providing a shaping carrier having an upper face and an opposite lower face, wherein the upper face comprising a plurality of curved surfaces;
   depositing an adhesive lower layer having a thickness larger than the thickness of the lower conductive pads, so as: either to entirely cover the opposite lower face of the microelectronic substrate and the lower conductive pads such that the adhesive lower layer has a free lower face that is continuous and therefore not passed right through by the lower conductive pads which would otherwise protrude from the adhesive lower layer; or to cover the plurality of curved surfaces;
   dicing at least the microelectronic substrate to singulate the plurality of microelectronic components; then
   transferring the plurality of microelectronic components to the shaping carrier; then
   bending the plurality of microelectronic components, the adhesive lower layer then making contact with the lower face of the plurality of microelectronic components and with a corresponding curved surface, thus preventing the lower conductive pads from making contact with the plurality of curved surfaces; then
   producing conductive vias that extend through the shaping carrier and the adhesive lower layer from the opposite lower face of the shaping carrier, in order to emerge onto the lower conductive pads.

2. The process according to claim 1, wherein the lower conductive pads are placed on an isoline of a lower face of the plurality of microelectronic components, the isoline being predetermined as being a line of equidistance to the opposite lower face of the shaping carrier, when the plurality of microelectronic component has components have been joined to the shaping carrier and are bent with the curvature of the plurality of curved surfaces, the conductive vias having a uniform vertical dimension.

3. The process according to claim 2, comprising, after bending, a step of joining a handle substrate to the shaping carrier on a side of the plurality of curved surfaces, so as to allow a stack thus obtained to be handled in the step of producing the conductive vias.

4. The process according to claim 3, wherein the handle substrate joined to the shaping carrier is joined to a free end of sidewalls, which are located between and encircle the plurality of curved surfaces.

5. The process according to claim 2, wherein each microelectronic component comprises upper conductive pads located on the upper face of the microelectronic substrate, and the conductive vias passing through the latter in order to emerge onto the opposite lower face of the microelectronic substrate, so as to encircle the isoline.

6. The process according to claim 2, wherein the lower conductive pads are placed in contact with the conductive vias of the plurality of microelectronic components, or are offset with respect to the conductive vias and are connected thereto by conductive lines.

7. The process according to claim 1, comprising, in a step of producing the microelectronic structure, an operation of joining a temporary handle substrate to the microelectronic substrate on a side of the upper face.

8. The process according to claim 7, comprising a step of thinning the microelectronic substrate, from the opposite lower face opposite the temporary handle substrate joined to the microelectronic substrate.

9. The process according to claim 7, wherein, after transferring and before bending, the temporary handle substrate joined to the microelectronic substrate is removed from each microelectronic component.

10. The process according to claim 1, wherein the shaping carrier is a single piece of one given material.

11. The process according to claim 10, wherein the shaping carrier is made of a thermally conductive material.

12. The process according to claim 1, wherein the plurality of microelectronic components are optical components for emitting or detecting light radiation.

13. The process according to claim 1, wherein:
   in the step of transferring the plurality of microelectronic components to the shaping carrier, the plurality of microelectronic components are all joined to the temporary handle substrate;
   the step of transferring the plurality of microelectronic components to the shaping carrier is carried out so that the plurality of microelectronic components rest on and adhere to, via a bearing region of the opposite lower face, an upper surface of sidewalls of the shaping carrier that encircle the plurality of curved surfaces;
   a step of removing the temporary handle substrate is then carried out;
   a step of bending the plurality of microelectronic components is then carried out, so that the plurality of microelectronic components are bent, and adhere to the plurality of curved surfaces via an intermediate adhesive layer, the latter then making contact with a lower face of each microelectronic component and with a corresponding curved surface.

14. The process according to claim 13, comprising, before the step of removing the temporary handle substrate joined to the plurality of microelectronic components, increasing temperature to a first temperature comprised in a temperature range of cross-linkage of the intermediate adhesive layer, then, during or after bending, increasing temperature to a second temperature comprised in the cross-linkage temperature range and above the first temperature.

* * * * *